United States Patent [19]

Golnabi et al.

[11] Patent Number: 5,088,061
[45] Date of Patent: Feb. 11, 1992

[54] ROUTING INDEPENDENT CIRCUIT COMPONENTS

[75] Inventors: Habib Golnabi, Dallas; William C. Martin; Timothy J. Powers, both of Carrollton, all of Tex.

[73] Assignee: VLSI Technology, Inc., San Jose, Calif.

[21] Appl. No.: 557,228

[22] Filed: Jul. 24, 1990

[51] Int. Cl.⁵ .............................................. G11C 13/00
[52] U.S. Cl. .................................. 365/189.01; 365/78
[58] Field of Search ....................... 365/189.01, 73, 75, 365/78

[56] References Cited

U.S. PATENT DOCUMENTS 4,873,671 10/1989 Kowshik et al. .................... 365/78

Primary Examiner—Terrell W. Fears
Attorney, Agent, or Firm—Burns, Doane, Swecker & Mathis

[57] ABSTRACT

A method and apparatus are disclosed for storing and accessing information of both asynchronous and synchronous devices using, for example, pointers having grey code counters which reduce code conversion logic and which are less susceptible to clock glitches, such as improper clock pulses due to internal circuit timing errors. Because the devices are less clock dependent, they do not require the imposition of critical paths during the placement and routing of a circuit layout. Further, fast and reliable accessing of information stored in memory devices can be achieved by multiplexing output bits addressed, for example, via the aforementioned grey code pointers.

25 Claims, 3 Drawing Sheets

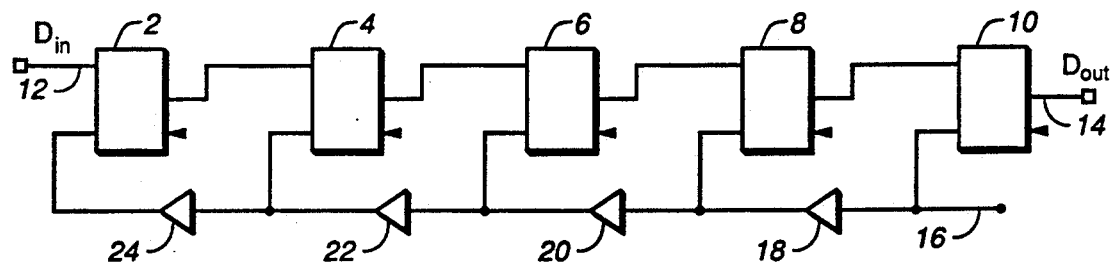
FIG._1
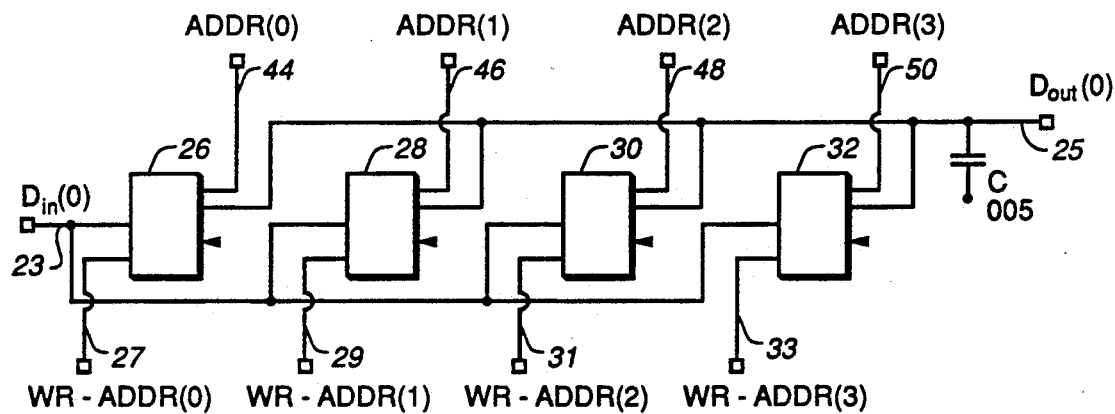
FIG._2A
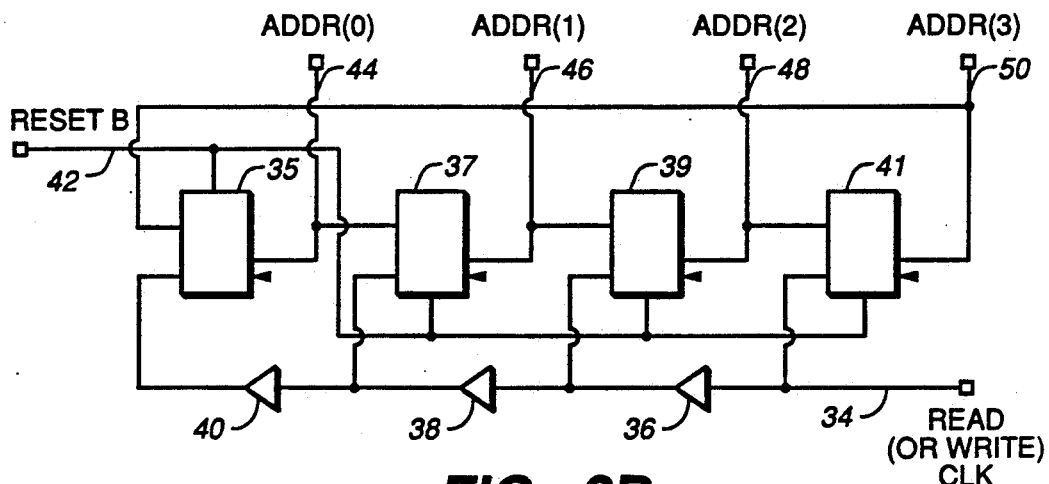
FIG._2B

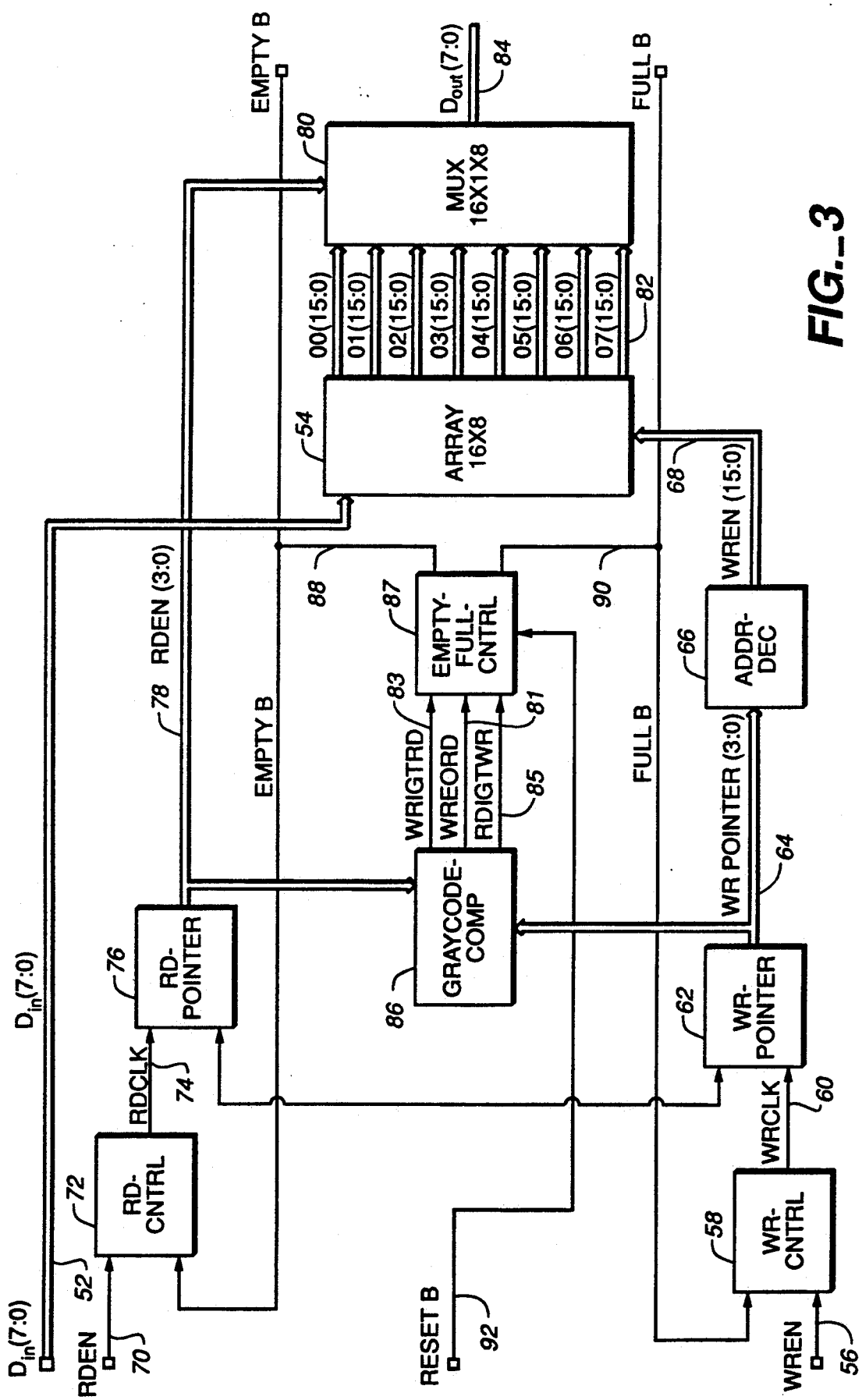
FIG._3

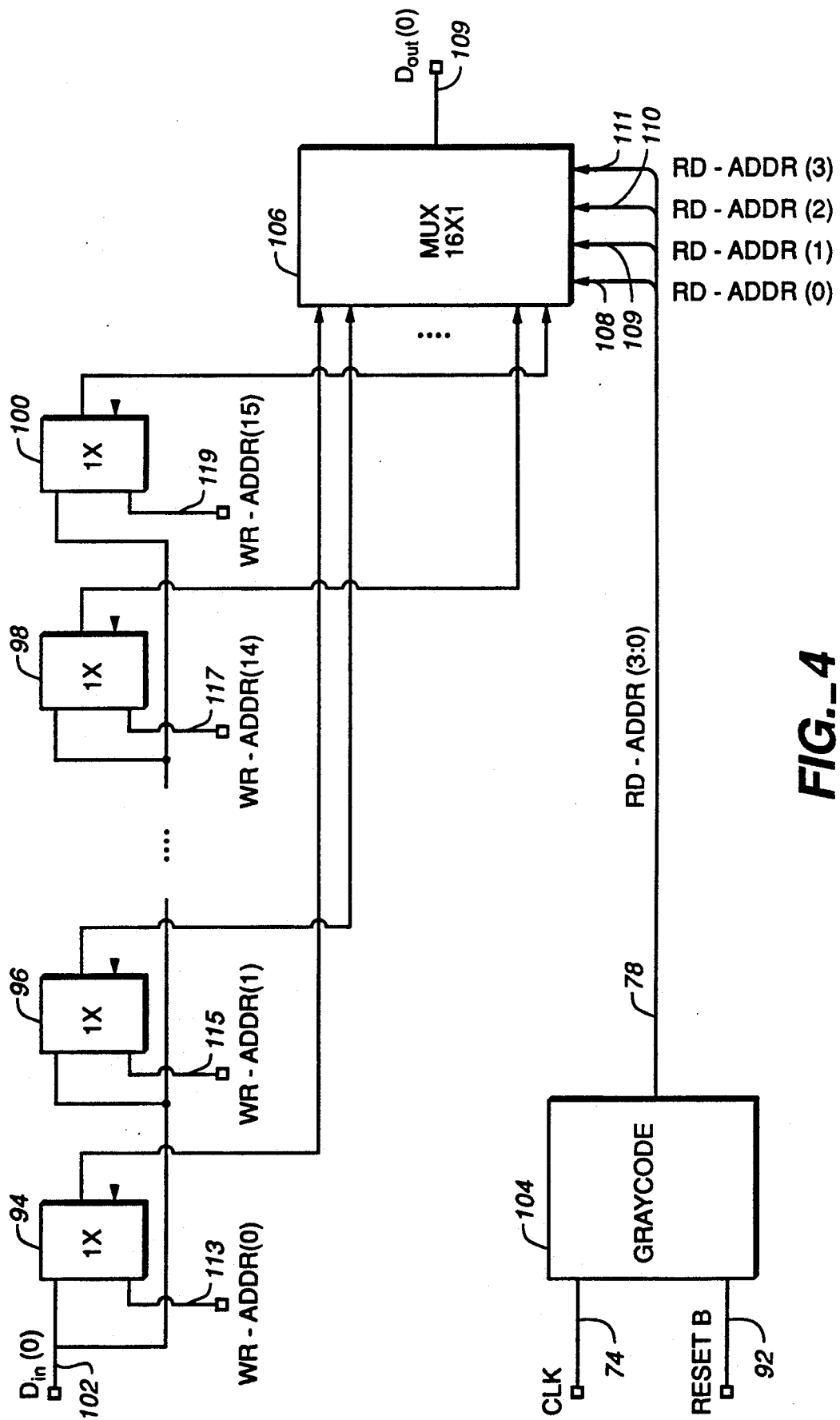
FIG._4

ROUTING INDEPENDENT CIRCUIT COMPONENTS

BACKGROUND OF THE INVENTION

1. Field of the Invention

The present invention relates generally to the design of integrated circuits and, more particularly, to the design of circuit components for placement in an integrated circuit layout.

2. State of the Art

A first-in first-out (FIFO) memory device generally includes a plurality of memory cells (e.g., flip-flops) that are arranged to form registers for storing a corresponding number of data bits and for permitting storage of at least one digital word. In addition to memory cells, conventional FIFO memory devices include circuit components for achieving the first-in, first-out operation. For example, FIG. 1 shows a single bit from each of five registers of a conventional FIFO memory device. The memory cells 2, 4, 6, 8 and 10 can each be, for instance, a flip-flop that stores a single bit from each of five words input to the FIFO memory device on data input line 12, labelled "din". If 8-bit words were to be stored in the FIFO memory device, eight rows of flip-flops as shown would be provided.

In operation of the FIFO memory device of FIG. 1, input data on line 12 is shifted through the five registers to data output line 14. Thus, the FIFO memory device operates like a shift register, with data being transferred one register to the right upon the occurrence of each read or write clock pulse on clock input line 16. When writing information into the FIFO memory device or when reading information out, the clock input on line 16 is directly input to flip-flop 10 to place the information stored in flip-flop 10 onto data output line 14. A single clock is therefore used to effect both read and write operations.

Further in the FIFO memory device in FIG. 1, the input signal on clock line 16 is provided to a series of delay gates 18, 20, 22 and 24 to cause a sequential transfer of data to the right, and to ensure that data is not overwritten. The delay associated with each of delay gates 18-24 thus corresponds approximately to the time required for data to be shifted out of one of flip-flops 2-10. Accordingly, after data has been shifted out of flip-flop 10, the signal or clock input line 16 appears at the output of delay gate 18 to clock data out of flip-flop 8 and into flip-flop 10. Subsequently, the signal on clock input line 16 appears at the output of delay gate 20 to clock data out of flip-flop 6 and into flip-flop 8. A sequential transfer of data occurs until any data present on data input line 12 is clocked into flip-flop 2.

Further in the FIFO memory device in FIG. 1, to guarantee that previously stored data will not be overwritten prior to being accessed at data output line 14, the clock signal and the stored data are shifted in opposite directions. That is, data is shifted to the right while the clock signal is shifted to the left. A Texas Instruments document labelled "SN74S225 16×5 Asynchronous First-In First-Out Memory" discloses one such device wherein a single clock signal is generated for both read and write operations. Further, a document labelled "CD 54/74 HC 40105 CD 54/74 HCT 40105" discloses another similar device.

A primary constraint of FIFO memory devices such as the one shown in FIG. 1 is that such devices require that the clock delay associated with each memory cell be accurately determined and implemented in the integrated circuit layout. Further, because a single clock performs both read and write operations by strobing data into flip-flop 2 for a write operation and by strobing data out of flip-flop 10 for a read operation, five read/write clock pulses are required before data input to the FIFO memory device can be accessed. Also, if a circuit component connected with data output line 14 is not yet ready to accept information from the FIFO memory device upon occurrence of a read or write clock pulse, the data output from flip-flop 10 could be lost unless additional control logic is provided at the FIFO memory device output to accommodate such a situation.

Yet another known FIFO memory device is shown in FIGS. 2A and 2B, wherein single memory cells for each of four registers are depicted as elements 26, 28, 30 and 32 in FIG. 2A. In this architecture, a ring counter such as that of FIG. 2B is used to address one of the memory cells of FIG. 2A via write lines 27, 29, 31 and 33 or one of read address lines 44, 46, 48 and 50. Data is written into an addressed one of the FIG. 2A memory cells via data input line 23 (labelled "din"). Data is read out of one of the memory cells via data output line 25 (which has a load capacitance "C", and is labelled "dout").

To select one of write address lines 27, 29, 31, or 33 during a write operation of the FIFO memory device of FIGS. 2A, a ring counter as shown in FIG. 2B can be employed. A similar counter is provided for selecting one of read address lines 44, 46, 48 or 50. Because of the similarity of the two ring counters required, only a ring counter for selecting the read address lines of the FIG. 2A memory cells will be described. A document labelled "SN54ALS233 A, SN74ALS233 A 16×5 Asynchronous First-In, First-Out Memories" discloses a FIFO memory device which employs addressing via a ring counter technique.

As with the FIG. 1 circuit, a read (or write) clock signal is sequentially input via clock input line 34 and delay gates 36, 38 and 40, to each of four flip-flops 35, 37, 39 and 41. The FIG. 2B ring counter is initialized via reset line 42 to a 4-bit binary value of "1000", for example, with each of the bits in this binary value corresponding to an address for one of the FIG. 2A memory cells. During proper operation, the FIG. 2A memory cell being selected by the FIG. 2B flip-flop possessing the "1" is considered "active". With each read (or write) clock pulse on clock input line 34, the "active" flip-flop passes the "1", which serves an a "active pointer" to identify the next sequential FIG. 2A memory cell (i.e., "1000"-"0100"-"0010"-"0001"-"1000"). Thus, the FIG. 2B circuit functions like a ring counter whereby each of memory cells 26-32 is sequentially activated via the active pointer and clock input line 34. As each memory cell is addressed, data is read from (or written into) the memory cell via address lines 44, 46, 48 and 50. Because no shifting of data among memory cells occurs, two separate read and write pointers are required to identify the "active" read memory cell and the "active" write memory cell.

In practice, the FIFO memory device of FIG. 2 has data accessing problems similar to those of the memory device of FIG. 1. That is, delays associated with accessing information exist due to the read/write pointer generation. Because data is no longer shifted, overwrite concerns are essentially eliminated. However, address data output line 25 is typically a shared bus which possesses load and wire interconnect RC delays when driving the output to a different state (e.g., high to low, or vice versa). Thus, whenever a new address is provided, the data output from the addressed memory cell must charge (or discharge) a bus connecting data lines for each of memory cells 26-32 to the new output value. Accordingly, output to the shared bus can possess more than two states in transitioning from a low to a high value, or vice versa, due to the connection of plural driving devices such as memory cells to a common bus. Because a common output bus is used, each memory cell has to drive the buffer directly connected to the outputs of all four FIG. 2A memory cells. This increased load can be represented as the increased capacitance "C" shown at the memory cell outputs, and involves a relatively large charging-time constant. Thus, in addition to access timing delays associated with pointer operation, the FIG. 2 FIFO memory device includes access delays due to output charging time. The greater the number of registers included in the FIFO memory device, the greater these delays become. With a larger number of registers, a larger number of ring counter addresses must be provided and a greater load will be associated with the output bus.

Further, because the FIG. 1 and FIG. 2 circuits require precise coordination of pointer delays and clock timing, placement of functional blocks in an integrated circuit layout during circuit layout fabrication of these FIFO memory devices is critical. For example, because the FIFO memory devices of FIGS. 1 and 2 are clock dependent in that they rely on delayed clock pulses to access data, such circuits are highly susceptible to clock glitches (i.e., errant clock pulses due to, for example, timing errors such as propagation delays). As described above, the possibility of data overwrite exists with the FIG. 1 circuit. Should a clock pulse appear at memory cell 6 prior to its occurrence at memory cell 8 due to a timing error resulting from improper placement of functional blocks in the FIFO memory devices, data stored in memory cell 8 would be overwritten. Further, during proper operation, a flip-flop of the FIG. 2B pointer circuit will generally pass the active pointer clockwise (i.e., to the right) by causing the flip-flops to be clocked in a counter-clockwise direction using delay gates 36-40. However, if flip-flop 37 were clocked before flip-flop 39 due to a timing error, the active pointer, if present in flip-flop 37, would be lost. More generally, whenever the flip-flop possessing the active pointer is clocked, a "0" will be clocked into that flip-flop and the active pointer will be lost. No further memory cells can then be addressed subsequently until the FIG. 2B pointer circuit is reset via line 42.

Circuit components which require precise timing to function properly are generally identified as having "critical" paths during circuit layout fabrication. As referenced herein, a "critical path" is an electrical interconnection between functional blocks which must not exceed a predetermined length. Should nodes which define the bounds of a critical path be spaced further than the predetermined length, RC delays due to the path itself can cause timing problems for the circuit component. All functional elements of the FIG. 1 and FIG. 2 FIFO circuits must therefore be placed within relatively close proximity on an integrated circuit layout to ensure that predetermined timing constraints will be satisfied.

Accordingly, there exists a need in the prior art for accurately inputting and outputting information of both asynchronous and synchronous devices such as FIFO memory devices in a fast, reliable manner which does not require the designation of critical paths during placement and routing of integrated circuit layout designs. For purposes of the present discussion, a synchronous device is one which requires use of a clock pulse having a given clock period, while an asynchronous device requires no such constraint.

SUMMARY OF THE INVENTION

Generally speaking, the present invention provides a method and apparatus for storing and accessing information from both asynchronous and synchronous devices using code sequencers, such as grey code counters, wherein at most a single bit change occurs when transitioning from one output to another. When storing and accessing data, the method and apparatus of the present invention provides reduced susceptibility to errors such as errors in decoding pulses arising from internal circuit timing errors or multiple bit changes. Because devices according to the present invention are less clock-dependent, they do not require the imposition of critical paths during the placement and routing of a circuit layout, thus enhancing the placement and routing speed of integrated circuit layouts which include these devices.

Further in accordance with the present invention, fast and reliable accessing of stored information can be achieved by multiplexing output bits addressed, for example, via the aforementioned code sequencers. Asynchronous and/or synchronous operation can also be attained without imposition of logic changes in the circuitry.

In one preferred embodiment according to the present invention, a routing-independent FIFO memory device includes a means for receiving and storing digital information having means for storing including at least two registers of memory cells. The FIFO memory device further includes means for generating a write-enable signal to input digital information to the means for storing, means for generating a read-enable signal to output digital information from the means for storing, and means for addressing at least two registers of memory cells in response to the read and write enable signals, the means for addressing further including a first grey code counter whose count identifies one of the registers of memory cells during a write operation and a first decoder for selecting the register identified by the first grey code counter. The FIFO memory device further includes a second grey code counter whose count identifies one of the registers of memory cells during a read operation and a multiplexer having a second decoder for selecting the register identified by the second grey code counter. Means for continuously comparing the count of the first and second grey code counters further generate memory full and memory empty signals to disable the means for generating a write enable or read enable, respectively.

BRIEF DESCRIPTION OF THE DRAWINGS

The present invention can be further understood with reference to the following detailed description of preferred embodiments in conjunction with the accompanying drawings, wherein like elements are provided like reference numerals, and wherein:

FIG. 1 is a drawing of a portion of a FIFO memory device of conventional architecture;

FIGS. 2A and 2B are drawings that show other known architectures of FIFO memory devices;

FIG. 3 is a schematic drawing of a FIFO memory device in accordance with the invention; and, FIG. 4 is a more detailed view of a portion of the FIFO memory device of FIG. 3.

DETAILED DESCRIPTION OF THE PREFERRED EMBODIMENTS

In the FIFO memory device shown in FIG. 3, an 8-bit data bus 52 provides information to be stored in any one of sixteen 8-bit registers forming memory array 54. An 8-bit word of data received on bus 52 is stored in an 8-bit register of the memory array which is addressed by write circuitry of the FIFO memory device architecture during a write operation. Each of the 8-bit registers is, for example, comprised of eight memory cells such as eight flip-flops.

In operation of the FIFO memory device of FIG. 3, a write enable signal "WREN" is provided via line 5 to write control block 58. The block 58 then passes a write clock signal (WRCLK) on line 60 to write pointer block 62. Preferably, write pointer block 62 includes a 4-bit code sequencing device, such as a 4-bit grey code counter, which is clocked by the write clock signal for providing a 4-bit write pointer to memory array address decoder 66 via address line 64.

Grey code counters are devices which provide a sequential output count wherein, during counting, only one bit of the counting code changes at any given time. For example, a 4-bit grey code counter would provide outputs corresponding to all sixteen counts of a conventional binary counter (i.e., 0000 through 1111) but would do so using a counting sequence wherein only one of the bits in the count would change state in sequencing from one count to the next. Because only a single bit of the grey code counter output changes at any given time, glitches in the count due to timing errors such as propagation delays are substantially reduced or eliminated since code conversion logic is reduced. For example, since only one bit of the count changes, there is no need to time accurately the arrival of two bits from the counter output through a decoder to address the next location of the memory array wherein information on data bus 52 is to be written. In accordance with the preferred embodiment to be described with respect to FIG. 3, a grey code sequence which could be used for the read and write operations to be described hereinafter is as follows:

0000
0001
0011
0010
0110
0111
0101
0100
1100
1101
1111
1110
1010
1011
1001
1000
0000

In a conventional counter by way of contrast, two or more bits of the counter output may change state at any given time such that there would be increased potential for glitches to occur in, for example, a FIFO memory device address pointer circuitry. Capacitive load changes on the counter output lines during the transition of plural counter output bits could cause certain lines of a counter output decoder to inadvertently remain low or be pulled high for shorter or longer periods of time so that the decoder could incorrectly address the memory array, causing an overwrite to occur. Such occurrences are significantly reduced via the use of the aforementioned pointers which include grey code counters.

Upon the change of a single bit of the 4-bit count from the grey code counter in the write pointer block, the memory array address decoder 66 of FIG. 3 provides a 16-bit address. This 16-bit address provides one active bit for identifying a respective one of the sixteen register locations in memory array 54 via address line 68, which includes sixteen individual lines (4 of which are shown in FIG. 4 as lines 113, 115, 117 and 119), as will be described below.

Reading of information stored in memory array 54 is achieved via use of read-enable line 70. A read enable signal (RDEN) appearing on line 70 is input to read control block 72, which produces a read clock signal (RDCLK) on line 74. The read clock signal (RDCLK) is used to drive a 4-bit code sequencing device, such as a grey code counter, in read pointer block 76. The 4-bit grey code counter in the read pointer block functions in a manner similar to that described above with respect to the grey code counter in the write pointer block 62. However, unlike the output of the write pointer block, the 4-bit count produced by the read pointer block is input to a 16:1 multiplexer block 80 via a 4-bit read address line 78. The multiplexer block 80 includes one or more known multiplexer circuit components, each having a decoder for converting the 4-bit grey code count into one of sixteen unique addresses for selecting one of the sixteen 8-bit registers of memory array 54. For example, in a preferred embodiment of the FIFO memory device, the multiplexer block 80 includes eight 16:1 multiplexers, with each of the multiplexers selecting one of the eight bits in each of the sixteen registers of memory array 54. The eight multiplexers of multiplexer block 80 thus permit the contents of a selected register in memory array 54 to be placed on an 8-bit data output line 84.

For this purpose, a bus 82 having eight 16-bit data lines interconnects each of the memory cells in memory array 54 with the multiplexer block 80. Each of the 16:1 multiplexers responds to address information from the read pointer block to select a respective one of the eight bits from the addressed register. Thus, upon receipt of a read enable signal on line 70, data in the selected one of the sixteen memory array registers which is continuously present at the input of the multiplexer block 80 via memory array data output bus 82 is selected and output on the 8-bit data output line 84.

To ensure that a write operation does not occur when all registers of the memory array 54 are full, a grey code comparator 86 is further provided in a preferred embodiment of the FIFO memory device as shown in FIG. 3. The grey code comparator 86 receives the currently identified 4-bit grey code count present on line 78 for generating a read address, and the currently identified 4-bit grey code count present on line 64 for generating a write address. The grey code comparator decodes the sixteen possible situations where the grey code count associated with the read and write pointers are equal. Further, the grey code comparator decodes the sixteen possible situations where the write pointer count is one more in the grey code sequence than the read pointer count. Further, the grey code comparator 86 decodes the sixteen possible situations where the read pointer count is one count greater than the write pointer count. The grey code comparator 86 thus includes three output lines 81, 83, and 85. The comparator 86 provides a "WREQRD" signal on line 81 if the read and write pointer counts are determined to be identical. The comparator provides a "WRIGTRD" signal on line 83 if the write pointer count is one count greater than the read pointer count (i.e., is one count ahead in the grey code sequence being used). A "RDIGTWR" signal is provided on line 85 if the read pointer count is on count greater than the write pointer count (i.e., is one count ahead in the grey code sequence being used).

The decoding logic of the FIG. 3 comparator 86 could be implemented in any known fashion using a known logic synthesizer. For example, the known "VLSI Logic Synthesizer", a product of VLSI Technology, Inc., San Jose, California, can generate logic for decoding the desired 4 states used to produce the three output signals on lines 81, 83, and 85. The three signals on lines 81, 83, and 85 are input to an empty-full control block for signalling when memory array 54 is empty or full.

For example, if a "WREQRD" signal is present on line 81 indicating that the grey code count from read pointer block 76 and write pointer block 62 are equal, then all data which had been written into the memory array has been read out. A memory array empty signal on line 88 is therefore input by the empty-full control block to read control block 72 to inhibit the read enable signal on line 70 from passing to and incrementing the sequence of the grey code counter in read pointer block 76, since no data exists in the memory array 54 for readout via the multiplexer 80.

Further, the empty-full control block includes similar logic for producing a memory array "full" signal on output line 90. The memory array "full" signal signifies that the grey code counter of the write pointer may not be incremented for a further write operation until a read operation occurs, and thus avoids occurrence of a data overwrite. The "full" signal on output line 90 is input to write control block 58 to inhibit the write enable signal on line 56 from passing to write clock signal line 60 and incrementing the grey code counter of write pointer block 62. A full signal is produced on line 90 in response to receipt of the full on line 85. The "RDIGTWR" signal indicates that a read must occur before new data can be written into the memory array.

The "WRIGTRD" is a read pointer flag to further ensure that timing constraints of the FIG. 3 read/write architecture are satisfied. More specifically, the "WRIGTRD" indicates that the read pointer is one count behind the write pointer. For example, the "WRIGTRD" signal is used to set a latch which generates the memory empty signal on line 88 when one more read operation (i.e., upon subsequent occurrence of a "WREQRD" signal). Similarly, the "RDIGTWR" signal is a flag to indicate that the write pointer is one count behind the read pointer. For example, the "RDIGTWR" signal will condition the FIG. 3 architecture such that a full signal will be produced upon the occurrence of a subsequent write (i.e., upon occurrence of a "WREQRD" signal) occurs prior to a write operation.

The FIFO memory device of FIG. 3 further includes a reset line 92. An input signal on reset line 92 is received by the read and write pointer blocks and by the empty-full control block 89. When a signal is input by, for example, a user on reset line 92, both grey code counters are set to zero, and the address empty-full control block produces a memory array empty signal on output line 88 to permit complete overwrite of the memory array contents. In the preferred embodiment, overwriting of data stored in the memory array 54 may therefore occur in either of two ways: 1) following a read of a given register, data retained in that register may be overwritten; or 2) following generation of a reset signal on line 92, all information stored in the memory array 54 may be overwritten.

Read and write operations of the FIFO memory device of FIG. 3 can be further described in greater detail with respect to FIG. 4. As described previously, grey code counters are used in the preferred embodiment; therefore, instead of each address input to memory array 54 having a separate flip-flop as in conventional FIFO memory devices, n flip-flops are used to generate $2^n$ addresses. In the FIFO memory device of FIG. 3, 4-bit grey code counters and a decoder are therefore used to provide sixteen unique addresses for memory array 54.

FIG. 4 shows four flip-flops—94, 96, 98 and 100—which correspond to the first of the 8-bits in four of the sixteen registers included in the FIG. 3 memory array. The data input line 102 in FIG. 4 corresponds to the first of the eight lines which provide the 8-bits of data to a selected register of memory array 54. The grey code counter 104 corresponds to the aforementioned 4-bit grey code counter included in read pointer block 76. The grey code counter 104 receives a synchronous or asynchronous read clock enable via line 74, which drives the counter 104. The grey code counter can also be reset via the reset line 92 as described previously.

Upon the occurrence of each read clock pulse on line 74, the sequence of the 4-bit grey code counter is advanced to provide a new read address on the read line 78 for input to the multiplexer 106. The multiplexer 106 corresponds to the first of the eight 16:1 multiplexers included in the FIG. 3 multiplexer 80. The multiplexer 106 generates the 16 to 1 selection feature for the first bit of data (dout[0]) stored in the eight registers of memory array 54, which bit of data is placed onto output line 109 of output bus 84 in FIG. 3. As mentioned previously, a read address decoder is not required since the output multiplexer 106 has a built-in decoder. Each of the eight multiplexers receives the 4-bit address via line 78 to select the bit from the register whose stored data is to be output on the 8-bit bus 84. Because the eight multiplexers of multiplexer block 80 access all bits of information stored in memory array 54, upon decoding of the multiplexer address a register of stored data is immediately available at the multiplexer output line 84. Therefore, information stored in memory array 54 is accessed in the amount of time required for the grey code counter output to propagate to selection inputs 108, 109, 110, and 111 of the multiplexer 106 and is not dependent on the recharge time associated with an output node as in conventional FIFO memory devices.

A write operation is performed in the manner described previously. A grey code counter similar to counter 104 is provided in the write pointer block 62.

The output count of this counter is decoded in address decoder 66 to select one of the sixteen registers in memory array 54. Thus, with respect to FIG. 4, an output of the address decoder selects one of the 16 flip-flops represented by flip-flops 94 to 100 via write address lines 113, 115, 117 and 119 of the write address bus 68. A selected one of flip-flops 94 to 100 stores the first bit of an 8-bit data word received via data input line 52. Data input line 102 therefore corresponds to the first of eight data lines which compose the 8-bit bus 52.

In light of the foregoing discussion, it should be apparent that the data stored in the memory array registers and the read/write clock signal are not shifted in opposite directions. Rather, the write address pointer determines where data received via the input bus 52 will be written; once written into a specified register, the data is not shifted during subsequent read or write operations. Further, once written into memory, the data can not be destroyed until it has either been read out or until the read/write pointers have been reset. Because only a single bit of the write pointer output changes, the write address decoder is less likely to cause spurious glitches.

The foregoing has described the principles, preferred embodiments and modes of operation of the present invention. However, the present invention should not be construed as being limited to the particular embodiments discussed. For example, although the preceding discussion has emphasized read and write pointers that include grey code counters, workers skilled in the art will recognize that other devices could be used that produce code sequences in any order wherein at most a single bit change in the code occurs during transitions between any two codes of the sequence actually employed for addressing. Also, it will be apparent to those skilled in the art that a FIFO memory device is not limited to sixteen 8-bit registers, but would be equally applicable to addressed storage devices having any number of registers with any number of bits. (Such storage devices include, but are not limited to, random-access memories, read-only memories, and so forth.) The present invention is also applicable to a last-in, first-out (LIFO) stack, provided that appropriate modification of the grey code comparator 86 is made.

Accordingly, the above-described embodiments should be regarded only as illustrative, and it should be appreciated that workers skilled in the art may make variations in those embodiments without departing from the spirit or scope of the present invention as defined by the following claims.

What is claimed is:

1. An apparatus having a routing independent architecture which comprises:
   means for receiving digital information;
   means for storing said digital information, said means for storing including at least two registers of memory cells;
   means for generating a write enable signal to input digital information to said means for storing;
   means for generating a read enable signal to output digital information from said means for storing;
   means for addressing said at least two registers of memory cells in response to said read and write enable signals, said means for addressing further including:
   a first means for producing a code sequence wherein at most one bit changes at any given time, said code sequence identifying one of said registers of memory cells during a write operation;
   a first decoder for selecting the register identified by said first code sequence producing means;
   a second means for producing said code sequence for identifying one of said registers of memory cells during a read operation;
   a second decoder for selecting the register identified by said second code sequence producing means; and
   means for continuously comparing the code sequence of said first and second code sequence producing means, said comparing means further generating memory full and empty memory signals to disable said means for generating a write enable or read enable signal, respectively.

2. An apparatus according to claim 1, wherein:
   said second decoder is part of a multiplexer which continuously receives signals stored in at least one of said registers.

3. An apparatus according to claim 1, wherein:
   said write enable signal drives said first code sequence producing means.

4. An apparatus according to claim 1, wherein:
   said read enable signal drives said second code sequence producing means.

5. An apparatus according to claim 1, which further includes:
   means for resetting the code sequence of said first and second code sequence producing means to a predetermined value.

6. An apparatus according to claim 1, wherein said apparatus is a first-in first-out memory.

7. An apparatus according to claim 1, wherein said first code sequence producing means is a grey code counter, and said code sequence corresponds to outputs of said grey code counter.

8. An apparatus according to claim 7, wherein said second code sequence producing means is a grey code counter.

9. An apparatus for storing digital information comprising:
   means for receiving information to be stored;
   means for generating a write enable signal for allowing said information to be stored in said apparatus; and,
   a write pointer responsive to said write enable signal for addressing a location of said apparatus at which said information is to be stored, said write pointer further including a means for producing a code sequence wherein at most one bit changes at any given time, said code sequence being used for generating said address.

10. Apparatus according to claim 9, wherein said information is stored on a first-in first-out basis.

11. Apparatus according to claim 9, wherein said code sequence producing means is a grey code counter.

12. Apparatus for a storing and accessing information in designated locations of a memory array comprising:
   an array of memory cells;
   means for generating a read enable signal to access information stored in said array; and,
   a read pointer responsive to said read enable signal for addressing a location of said array from which stored information is to be read, said read pointer further including a means for producing a code sequence wherein at most one bit changes at any given time, said code sequence being used for generating said address.

13. Apparatus according to claim 12, further comprising:
a multiplexer for decoding the address generated by said grey code counter.

14. Apparatus according to claim 12, wherein said code sequence producing means is a grey code counter.

15. Apparatus according to claim 9, wherein said write pointer operates asynchronously.

16. Apparatus according to claim 12, wherein said read pointer operates asynchronously.

17. An apparatus having a routing independent architecture which comprises:
means for receiving digital information;
means for storing said digital information, said means for storing including an array of memory cells;
means for reading said stored digital information out of said means for storing, said reading means further including:
means for generating a read enable signal;
a counter responsive to said read enable signal, for producing an output count which is incremented With each read enable signal for identifying corresponding memory cells of said array; and,
a multiplexer for continuously receiving digital information stored in said corresponding memory cells identified by said count to render load capacitance independent of array size.

18. Apparatus according to claim 17, wherein said counter is a grey code counter.

19. An apparatus according to claim 17, wherein said apparatus is a first-in first-out memory.

20. Method for storing digital information comprising the steps of:
receiving information to be stored in a memory array;
generating a write enable signal for allowing said received information to be stored in said apparatus; and,
providing a write pointer in response to said write enable signal for addressing a location of said memory array at which said information is to be stored, said step of producing a write pointer further including a step of incrementing a code sequencing device wherein at most a single bit change of said code occurs at any given time for generating said address.

21. Method according to claim 20, wherein said information is stored on a first-in first-out basis.

22. Method according to claim 20, wherein said code sequencing device is a grey code counter.

23. Method for storing and accessing information in designated locations of a memory array comprising the steps of:
generating a read enable signal to access information stored in the memory array; and,
producing a read pointer in response to said read enable signal for addressing a location of said array from which stored information is to be read, said step of producing further including a step of advancing a code sequencing device wherein at most a single bit change of said code occurs at any given time for generating said address.

24. Method according to claim 23, further including the step of:
decoding said address via a multiplexer which continuously accesses said memory array.

25. Method according to claim 23, wherein said code sequencing device is a grey code counter.

* * * * *